US010727253B1

(12) United States Patent
Nowak

(10) Patent No.: US 10,727,253 B1
(45) Date of Patent: Jul. 28, 2020

(54) SIMPLIFIED MEMORY CELLS BASED ON FULLY-DEPLETED SILICON-ON-INSULATOR TRANSISTORS

(71) Applicant: GLOBALFOUNDRIES Inc., Grand Cayman (KY)

(72) Inventor: Edward J. Nowak, Shelburne, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 16/266,307

(22) Filed: Feb. 4, 2019

(51) Int. Cl.
*H01L 21/00* (2006.01)
*H01L 27/12* (2006.01)
*H01L 21/84* (2006.01)
*H01L 21/762* (2006.01)

(52) U.S. Cl.
CPC ...... *H01L 27/1203* (2013.01); *H01L 21/7624* (2013.01); *H01L 21/84* (2013.01)

(58) Field of Classification Search
CPC .......... H01L 27/11582; H01L 29/0847; H01L 29/40117
See application file for complete search history.

(56) References Cited

U.S. PATENT DOCUMENTS

| 3,889,245 | A | 6/1975 | Gosney |
| 4,493,060 | A | 1/1985 | Varshney |
| 5,386,384 | A | 1/1995 | Pedroni et al. |
| 6,421,269 | B1 | 7/2002 | Somasekhar et al. |
| 6,560,142 | B1 | 5/2003 | Ando |
| 6,778,424 | B2 | 8/2004 | Iwata et al. |
| 6,956,256 | B2 | 10/2005 | Forbes |
| 8,767,458 | B2 * | 7/2014 | Widjaja ............... H01Q 1/2283 365/177 |
| 9,570,465 | B2 * | 2/2017 | Vinet .................... H01L 21/762 |
| 9,590,001 | B2 * | 3/2017 | Assefa .............. H01L 27/14689 |
| 9,608,112 | B2 * | 3/2017 | Smith .................. H01L 21/743 |
| 10,559,490 | B1 * | 2/2020 | Smith ................ H01L 29/0653 |
| 10,593,674 | B1 * | 3/2020 | Chang ................ H01L 27/0928 |
| 2015/0294984 | A1 * | 10/2015 | Cheng ............... H01L 21/76224 257/347 |

(Continued)

OTHER PUBLICATIONS

G. Panigrahi, "Charge-Coupled Memories for Computer Systems", Computer, vol. 9, No. 4, pp. 33-42, Apr. 1976.

*Primary Examiner* — Laura M Menz
(74) *Attorney, Agent, or Firm* — Thompson Hine LLP

(57) ABSTRACT

Structures for a memory cell and methods associated with forming and using such structures. The structure includes a silicon-on-insulator wafer including a device layer, a substrate, and a buried insulator layer between the device layer and the substrate. The structure further includes a field-effect transistor having first and second source/drain regions and a gate electrode that are over the buried insulator layer. A moat region is arranged in the substrate beneath the field-effect transistor, a well is arranged in the substrate beneath the moat region, and an isolation region extends through the device layer and the buried insulator layer into the substrate. The isolation region is arranged to surround a portion of the device layer defining an active region for the field-effect transistor and a portion of the moat region. A fence region, which extends between the well and the isolation region, surrounds the portion of the moat region.

13 Claims, 6 Drawing Sheets

(56) References Cited

U.S. PATENT DOCUMENTS

2017/0287901 A1\* 10/2017 Dersch ................ H01L 27/0629
2020/0066573 A1\* 2/2020 Smith ................. H01L 29/0653
2020/0083223 A1\* 3/2020 Chang ................ H03K 19/0948

\* cited by examiner

SIMPLIFIED MEMORY CELLS BASED ON FULLY-DEPLETED SILICON-ON-INSULATOR TRANSISTORS

BACKGROUND

The present invention relates to semiconductor device fabrication and integrated circuits and, more specifically, to structures for a memory cell and methods associated with forming and using such structures.

Static random access memory (SRAM) or dynamic random access memory (DRAM) may be used, for example, to temporarily store data in a computer system. An SRAM or DRAM device includes an array of memory cells in which each memory cell retains a single bit of data during operation. Each SRAM memory cell may have a 6-transistor (6T) design that includes a pair of cross-coupled inverters and a pair of access transistors connecting the inverters to complementary bit lines. The two access transistors are controlled by word lines, which are used to select the SRAM memory cell for read or write operations. When continuously powered, the memory state of an SRAM persists without the need for data refresh operations.

Conventional DRAM memory cells may have a one transistor-one capacitor (1T-1C) design that includes a dedicated storage capacitor to store data in the form of electric charge, and a single metal-oxide semiconductor field-effect transistor (MOSFET) to access the storage capacitor for read and write operations.

Resistive random access memory (ReRAM) and magnetic random access memory (MRAM) provide embedded non-volatile memory technologies that contrast with other types of single-transistor memory technologies, such as DRAM. Because ReRAM and MRAM memory elements are non-volatile, stored data is retained when the memory elements are not powered, which contrasts with SRAM in which the stored data is eventually lost when unpowered and DRAM in which the stored data is lost if not periodically refreshed.

Improved structures for a memory cell and methods associated with forming and using such structures are needed.

SUMMARY

In an embodiment of the invention, a structure includes a silicon-on-insulator wafer including a device layer, a substrate, and a buried insulator layer between the device layer and the substrate. The structure further includes a field-effect transistor having a first source/drain region, a second source/drain region, and a gate electrode that are over the buried insulator layer. A moat region is arranged in the substrate beneath the field-effect transistor, a well is arranged in the substrate beneath the moat region, and an isolation region extends through the device layer and the buried insulator layer into the substrate. The isolation region is arranged to surround a portion of the moat region and a portion of the device layer. The portion of the device layer defines an active device region for the field-effect transistor. A fence region, which extends between the well and the isolation region, surrounds the portion of the moat region.

In an embodiment of the invention, a method includes forming a moat region in a substrate of a silicon-on-insulator wafer, forming a field-effect transistor including a first source/drain region, a second source/drain region, and a first gate electrode that are arranged over a buried insulator layer of the silicon-on-insulator wafer and the moat region, and forming an isolation region extending through the device layer and the buried insulator layer into the substrate. The isolation region is arranged to surround a portion of the moat region and a portion of the device layer, and the portion of the device layer defines an active device region for the first field-effect transistor. The method further includes forming a fence region arranged between the well and the isolation region, and forming a doped region of semiconductor material in the moat region. The fence region is arranged to surround the portion of the moat region beneath the field-effect transistor.

In an embodiment of the invention, a method includes providing a silicon-on-insulator wafer including a device layer, a substrate, and a buried insulator layer between the device layer and the substrate, and a field-effect transistor arranged over the buried insulator layer, and generating a storage region containing inversion charge in a portion of a moat region beneath a buried insulator layer of a silicon-on-insulator wafer in a vertical direction and localized laterally below a portion of the field-effect transistor. The field-effect transistor has a first threshold voltage before the inversion charge is stored in the storage region and a second threshold voltage after the inversion charge is stored in the storage region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
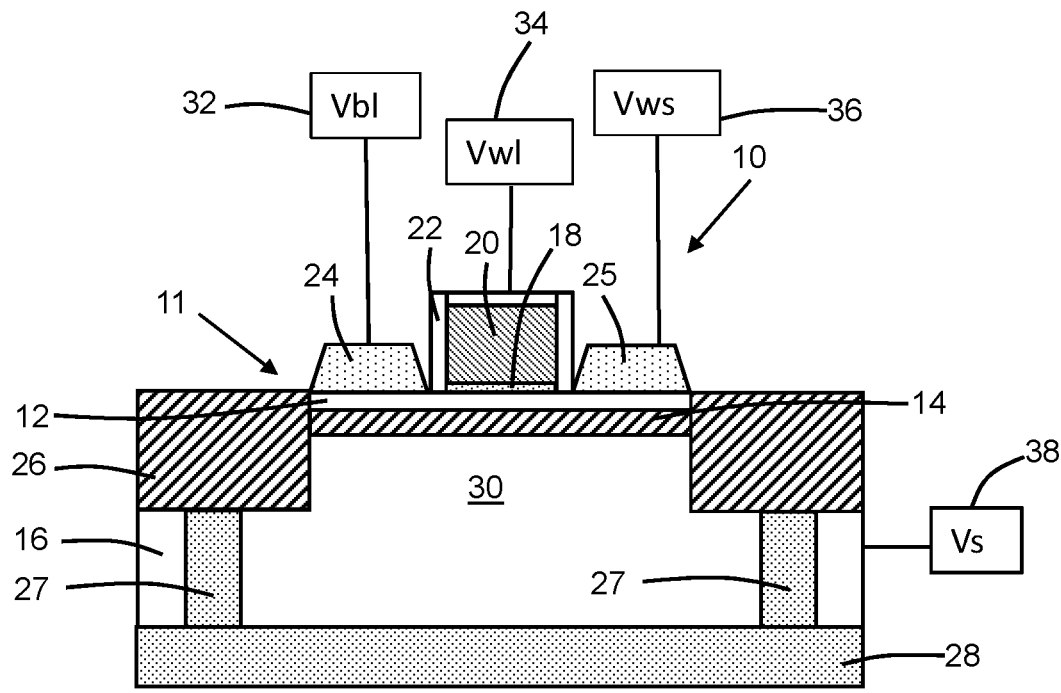
FIG. 1 is a cross-sectional view of a structure in accordance with embodiments of the invention.

With reference to FIG. 1 and in accordance with embodiments of the invention, a field-effect transistor 10 may be fabricated using a semiconductor-on-insulator (SOI) wafer by complementary metal oxide semiconductor (CMOS) processes during front-end-of-line (FEOL) processing. The SOI wafer includes a device layer 12, a buried insulator layer in the form of a buried oxide (BOX) layer 14, and a substrate 16. The device layer 12 is separated from the substrate 16 by the intervening BOX layer 14 and is considerably thinner than the substrate 16. The device layer 12 and the substrate 16 may be composed of a single-crystal semiconductor material, such as single-crystal silicon. In an embodiment, the SOI wafer may be an extremely thin semiconductor-on-insulator (ETSOI) wafer with a thin device layer 12 and a thin BOX layer 14, and may be used to fabricate the field-effect transistor 10 as a fully-depleted SOI (FDSOI) device. In an embodiment, the device layer 12 of the ETSOI wafer may have a thickness that ranges from about 3 nanometers (nm) to about 100 nm. In an embodiment, the device layer 12 of the ETSOI wafer may have a thickness in an ultra-thin regime (i.e., about 3 nm to about 10 nm) suitable to manufacture FDSOI devices. In an embodiment, the BOX layer 14 may have a thickness in a range from about 5 nm to about 50 nm that is suitable to manufacture FDSOI devices.

The field-effect transistor 10 includes a gate dielectric 18 and a gate electrode 20 that is separated from the device layer 12 by the gate dielectric 18. The gate dielectric 18 may be composed of one or more dielectric or insulating materials, such as silicon dioxide or hafnium oxide, and the gate electrode 20 may be composed of a conductor, such as doped polysilicon or one or more metals. Non-conductive sidewall spacers 22 may be provided adjacent to the sidewalls of the gate electrode 20. Source/drain regions 24, 25 are laterally arranged on opposite sides of the gate electrode 20. As used herein, the term "source/drain region" means a doped region of semiconductor material that can function as either a source or a drain of a field-effect transistor. In an embodiment, the semiconductor material of the source/drain regions 24 may be silicon and may contain an n-type dopant (e.g., phosphorus (P) and/or arsenic (As)) that provides n-type conductivity. In an embodiment, the source/drain region 24 may be the drain of the field-effect transistor 10 and the source/drain region 25 may be the source of the field-effect transistor 10.

An isolation region 26 is formed that surrounds the portion of the device layer 12 that includes the gate electrode 20 and the source/drain regions 24, 25. The isolation region 26 may be a deep trench isolation region that penetrates through the device layer 12 and the BOX layer 14 into the substrate 16. Alternatively, the isolation region 26 may be shallow trench isolation formed in the device layer 12 and extending to the BOX layer 14, or a field dopant that is positioned beneath a portion of each source/drain region 24.

A deep well 28 is arranged in the substrate 16 beneath the field-effect transistor 10 and may be formed before forming the field-effect transistor 10. The semiconductor material of the deep well 28 may contain a p-type dopant (e.g., boron (B)) that provides p-type conductivity, and may be formed by ion implantation. A moat region 30 is arranged beneath the field-effect transistor 10 and in the substrate 16 between the deep well 28 and the BOX layer 14. The moat region 30 is composed of semiconductor material having the same conductivity type as the deep well 28 and is more lightly doped (i.e., has a lower dopant concentration) than the deep well 28. For example, the moat region 30 may be lightly doped to contain a dopant concentration that is less than or equal to $5 \times 10^{15}$ cm$^{-3}$. The SOI wafer is masked over the moat region 30 during the ion implantations forming n-wells and p-wells in other sections of the SOI wafer. A portion of the moat region 30 is arranged inside the isolation region 26.

A fence region 27 is arranged below a portion of isolation region 26 and extends from the isolation region 26 to the deep well 28. The fence region 27 functions to impede diffusion of minority carries generated in outside regions of the substrate 16 into the portion of the moat region 30 inside the isolation region 26 and beneath the field-effect transistor 10. The fence region 27 may be a moderately-doped region of the same polarity or conductivity type as the deep well 28, and of comparable doping level to the deep well 28. The fence region 27 may be formed by a masked ion implantation process.

Middle-of-line (MOL) processing and back-end-of-line (BEOL) processing follow to form an interconnect structure that includes interconnects 32, 34, 36, 38 that are coupled with the field-effect transistor 10. The interconnect 32 provides a bit line that is connected with the source/drain region 24, the interconnect 34 provides a word line that is connected with the gate electrode 20, the interconnect 36 provides another word line that is connected with the source/drain region 25, and the interconnect 38 provides a voltage source that is connected with the substrate 16.

Figure 2:
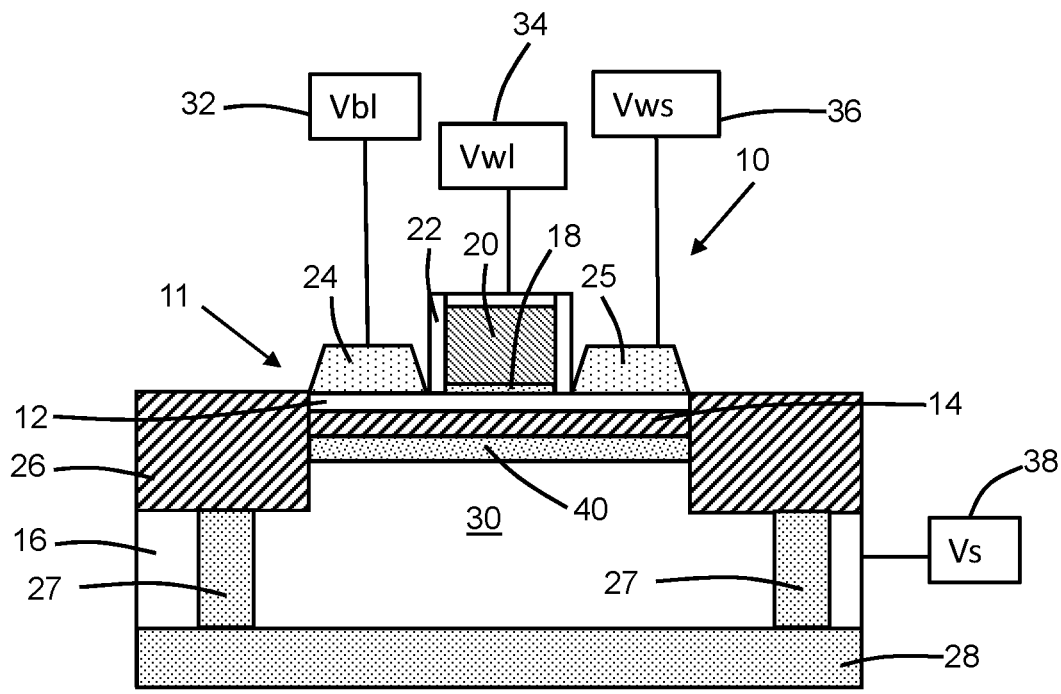
FIG. 2 is a cross-sectional view of the structure of FIG. 1 after being placed in a different state.

With reference to FIGS. 1 and 2, the field-effect transistor 10 may be used as a gain cell in a memory device to store a single bit of binary logic data by modulating the threshold voltage of the field-effect transistor 10. The substrate 16 has a given threshold voltage with the source/drain region 24 of the field-effect transistor 10 acting as a gate of a bulk Metal-Insulator-Semiconductor (MIS) device 11. If the voltage applied at the source/drain region 24 from the interconnect 32 providing the bit line is greater than a given value with respect to the voltage applied to the substrate 16, such that the MIS device 11 is depleted of majority carriers and the bands of the semiconductor are above the threshold of inversion, then the moat region 30 in the substrate 16 can support an inversion layer or region below the BOX layer 14; the inversion region must be supplied with charge by a source of free minority carriers. Hence, the MIS device 11 can be in any of a number of inversion-charge states, depending on the quantity of inversion carriers supplied. The degree of inversion is associated with the stored data. After some time, known as the retention time, minority carriers, which are unintentionally generated due to various mechanisms (e.g., thermal generation, band-to-band tunneling, defect-induced generation) can add to the initial inversion charge quantity in the inversion region, thus limiting the period of time for which stored charge retains its integrity.

As shown in FIG. 2, a portion of the moat region 30 in the substrate 16 may include a storage region 40 containing inversion charge. The portion of the moat region 30 that selectively includes the storage region 40 is arranged inside the isolation region 26 and inside the fence region 27. The storage region 40 may be forced to have no inversion charge by briefly (greater than about 1 nanosecond) forward accumulating the MIS device 11 by application of a voltage on the source/drain regions 24, 25 and gate electrode 20 that favors majority carriers at the surface (i.e., accumulation beyond the flat-band voltage), which will rapidly expel any inversion charges that may be present in the storage region 40. Subsequently, any desired state of inversion charge may be rapidly generated via band-to-band tunneling in the substrate 16, generated by application of a relatively large voltage, e.g., 1.2V to 2.0V, from source to drain of the field-effect transistor 10. A gate voltage slightly above the threshold voltage of field-effect transistor 10 can, optionally, reduce write time. During a read operation, a ramped voltage may be applied to the gate electrode 20 in response to which the inversion charge stored in the storage region 40 causes a predetermined signal response on the interconnect 32 providing the bit line that is then sensed as either a "logic zero" or a "logic one" by sensing circuitry within the memory device. When the inversion charge stored in storage region 40 is of a larger amount, the threshold voltage of the field-effect transistor 10 will be increased, and when the inversion charge stored in the storage region 40 is of a smaller amount, the field-effect transistor 10 will have a reduced threshold voltage.

A memory device would include a large number of the field-effect transistors 10 as gain cells for storing digital data within, for example, a computer system. The gain cell provided by the field-effect transistor 10 lacks a discrete storage element, such as a capacitor that is commonly found in a conventional DRAM memory cell.

Figure 3:
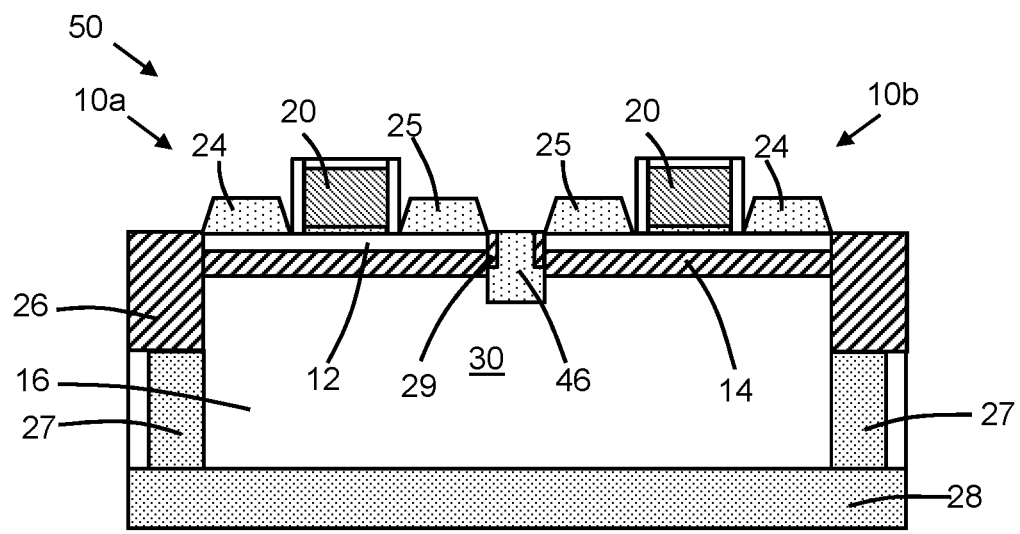
FIG. 3 is a cross-sectional view of a structure in accordance with embodiments of the invention.
Figure 4:
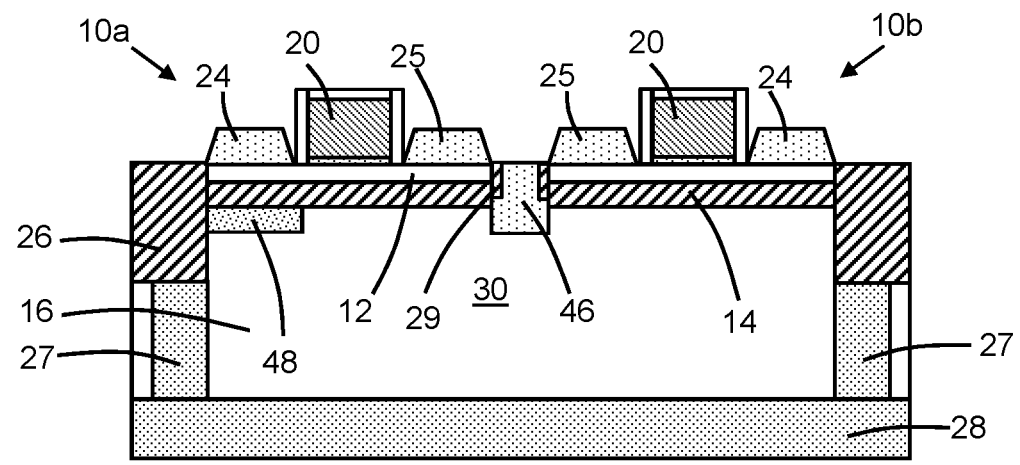
FIG. 4 is a cross-sectional view of the structure of FIG. 3 after being placed in a different memory state.
Figure 5:
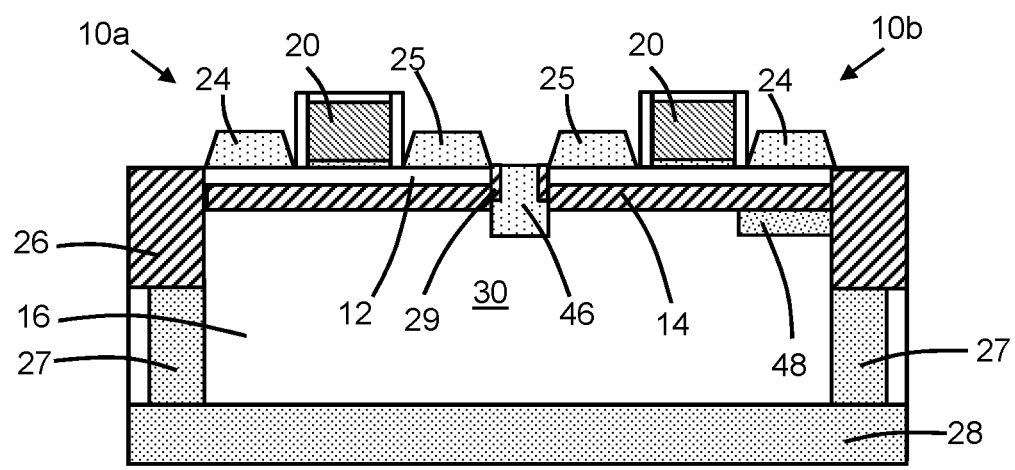
FIG. 5 is a cross-sectional view of the structure of FIG. 3 after being placed in a different memory state.

With reference to FIGS. 3, 4, 5 and in accordance with embodiments of the invention, multiple instances 10a, 10b of the field-effect transistor 10 may be combined to form a memory device 50 that is capable of storing two bits of binary data. Specifically, the instances 10a, 10b of the field-effect transistor 10 are fabricated using a section of the device layer 12 that is isolated about its perimeter by the isolation region 26. The instances 10a, 10b of the field-effect transistor 10 may be placed side-by-side or juxtaposed with a write source 46 that is arranged laterally between instance 10a of the field-effect transistor 10 and the instance 10b of the field-effect transistor 10. The write source 46 is a doped region of epitaxial semiconductor material formed in a trench that is etched to penetrate through the device layer 12 and the BOX layer 14 and to a shallow depth in the moat region 30 of the substrate 16. The write source 46 is electrically isolated from both instances 10a, 10b of the field-effect transistor 10 by a dielectric collar 29. The semiconductor material of the write source 46 may be doped with the same conductivity type (e.g., n-type) as the source/drain regions 24, 25 and, in an embodiment, may be heavily doped. The semiconductor material of the write source 46 may be doped with an opposite conductivity type from the deep well 28 and moat region 30. In an embodiment, the source/drain regions 24 may represent drain regions and the source/drain regions 24, 25 may represent source regions. A portion of the moat region 30 directly beneath the source/drain region 24 of each of the instances 10a, 10b, and the gate electrodes 20 in particular, of the field-effect transistor 10 can be inverted or depleted so as to individually modulate or change the threshold voltage of the different instances 10a, 10b of the field-effect transistor 10.

Virtual bulk field-effect transistors are defined that include the write source 46, the source/drain regions 25 of the instances 10a, 10b of the field-effect transistor 10, and portions of the moat region 30 beneath the source/drain regions 24 of the instances 10a, 10b of the field-effect transistor 10. The write source 46, which is shared by virtual bulk field-effect transistors, operates as a source of charge that can be selectively transferred to the portions of the moat region 30 beneath the source/drain regions 24. The source/drain regions 25, which are respectively arranged in the layout adjacent to the write source 46, act as gates to the write source 46 and provide the functionality of the selective data writing in the virtual bulk field-effect transistors. In an embodiment, the gate electrodes 20 may also act as gates to the write source 46, in addition to the source/drain regions 25 and in series with the source/drain regions 25, and contribute to providing the functionality of the selective data writing in the virtual bulk field-effect transistors.

The presence or absence of inversion charge permits the instances 10a, 10b of the field-effect transistor 10 to function as storage elements. If present during the storage state, a storage region 48 containing inversion charge is located in the moat region 30 of the substrate 16 immediately under the BOX layer 14 in a vertical direction and localized laterally below the source/drain regions 24 of one or both of the instances 10a, 10b of the field-effect transistor 10. Stored inversion charge provides a high memory state equal to a "logic one", as opposed to a low memory state equal to a "logic zero" in which the inversion charge is absent. In an alternative embodiment, one or more additional memory states may be provided by storing an amount or amounts of inversion charge between the low and high memory states. Thus, a continuous level, or analog storage operation, is enabled by embodiments of the invention. The stored inversion charge is isolated within the storage region 40 by a combination of the isolation region 26 and the voltage (favorable to accumulation) applied at the gate electrode 20. During read operations, the voltage applied to the gate electrode 20 (favorable to inversion) allows a portion of the stored charge in the storage region 48 to spread laterally in the moat region 30 below the gate electrode 20, thereby affecting the device threshold voltage.

The instances 10a, 10b of the field-effect transistor 10 and the write source 46 may be used as a pair of gain cells in the memory device 50. In FIG. 3, the gain cells associated with the memory device 50 are placed in a low memory state equal to a "logical zero" in which the storage region 48 of inversion charge is absent. In FIG. 4, the gain cell associated with the instance 10a of the field-effect transistor 10 is placed in a high memory state equal to a "logical one" in which the storage region 48 of inversion charge is present. In FIG. 5, the gain cell associated with the instance 10b of the field-effect transistor 10 is placed in a high memory state equal to a "logical one" in which the storage region 48 of inversion charge is present. Although not shown, the gain cells associated with both of the instances 10a, 10b of the field-effect transistor 10 may be placed in a high memory state in which respective storage regions 48 of inversion charge are concurrently present in the memory device 50.

The different storage regions 40, one in a portion of the moat region 30 beneath the instance 10a and the other in a portion of the moat region 30 beneath the instance 10b, can be independently written with inversion charge by keeping their respective sources and gates 'OFF' for the non-selected gain cell, and 'ON' for the selected gain cell. For example, the voltages applied to the instance 10a of the field-effect transistor 10 to write inversion charge would be set to high values (e.g., VDD), the voltages applied to the instance 10b of the field-effect transistor 10 would concurrently be set to low values (e.g., 0V), and the write source 46 would be adjusted to provide the desired inversion charge in the storage region 48 beneath the source/drain region 24 of the instance 10a. No inversion-charge transfer would transpire to the source/drain region 24 beneath the instance 10b because the path to the write source 46 would be blocked by the potentials beneath its gate electrode 20 and the source/drain region 25 operating as its source in this example.

As shown in FIG. 4, a write operation may generate and store the storage region 48 of inversion charge in a portion of the moat region 30 in the substrate 16 beneath the source/drain region 24 of the instance 10a of the field-effect transistor 10 associated with one of the gain cells. To that end, the source/drain regions 24 of both instances 10a and 10b are biased to a positive power supply (VDD) to enable inversion storage beneath these regions. The source/drain region 25 and the gate electrode 20 of the instance 10a of the field-effect transistor 10 are biased to a positive voltage, such as the positive power-supply voltage (VDD). An amount of inversion charge is transferred from the write source 46 through portions of the moat region 30 beneath the gate electrode 20 and the source/drain region 25 to the portion of the moat region 30 in the substrate 16 beneath the source/drain region 24. The inversion charge is confined and stored in the storage region 48. The amount of transferred inversion charge is proportional to the voltage applied to source/drain region 24, with respect to the voltage applied to write source 46, less that of the bulk threshold voltage (typically approximately −0.2V), mathematically stated, $V_{SD24}-V_{T-BULK}-V_{WS46}$. The formation of the storage region 48 containing a relatively large amount of inversion charge is attained by application of a low voltage (e.g., 0V) at the write source 46 corresponding to a high memory state (e.g., 'logical one') to the instance 10a of the field-effect transistor 10, while a high write voltage (e.g., VDD) at the write source 46 will result in a relatively low value of inversion charge corresponding to a low memory state (e.g., 'logical zero'). Alternatively, a continuous value of inversion charge, attained via continuous values of voltages applied by the write source 46, can represent storage of analog (continuous) data. The source/drain region 25 and the gate electrode 20 of the instance 10b of the field-effect transistor 10 are biased low, e.g., at 0V, during the write operation for instance 10a, to isolate the storage region 48 beneath the source/drain region 24 of instance 10b from the write source 46, maintaining the amount of inversion charge present in that storage region 48. The instance 10a of the field-effect transistor 10 has a given threshold voltage when the storage region 48 of inversion charge is present and a different threshold voltage when the storage region 48 of inversion charge is absent.

Similarly, as shown in FIG. 5, a write operation may generate and store the storage region 48 of inversion charge in a portion of the moat region 30 in the substrate 16 beneath the source/drain region 24 of the instance 10b of the field-effect transistor 10 associated with the other of the gain cells. To that end, the voltage conditions for the instances 10a and 10b are simply interchanged from the write operation may generating and storing the storage region 48 of inversion charge in a portion of the moat region 30 in the substrate 16 beneath the source/drain region 24 of the instance 10b.

The memory state of either of the gain cells may be read by maintaining a bias voltage (e.g. VDD) at the source/drain region 24 and a bias voltage at the source/drain region 25, differing from that of source/drain region 24, to generate a potential difference between the source/drain region 24 and source/drain region 25, and then applying one or more sequential bias voltages to the gate electrodes 20. The sensed current from the source/drain region 24, or the source/drain region 25, indicates whether the associated gain cell is in a low memory state or a high memory state. The amount of inversion charge stored in either storage region 48 is unchanged by the respective read operations.

Figure 6:
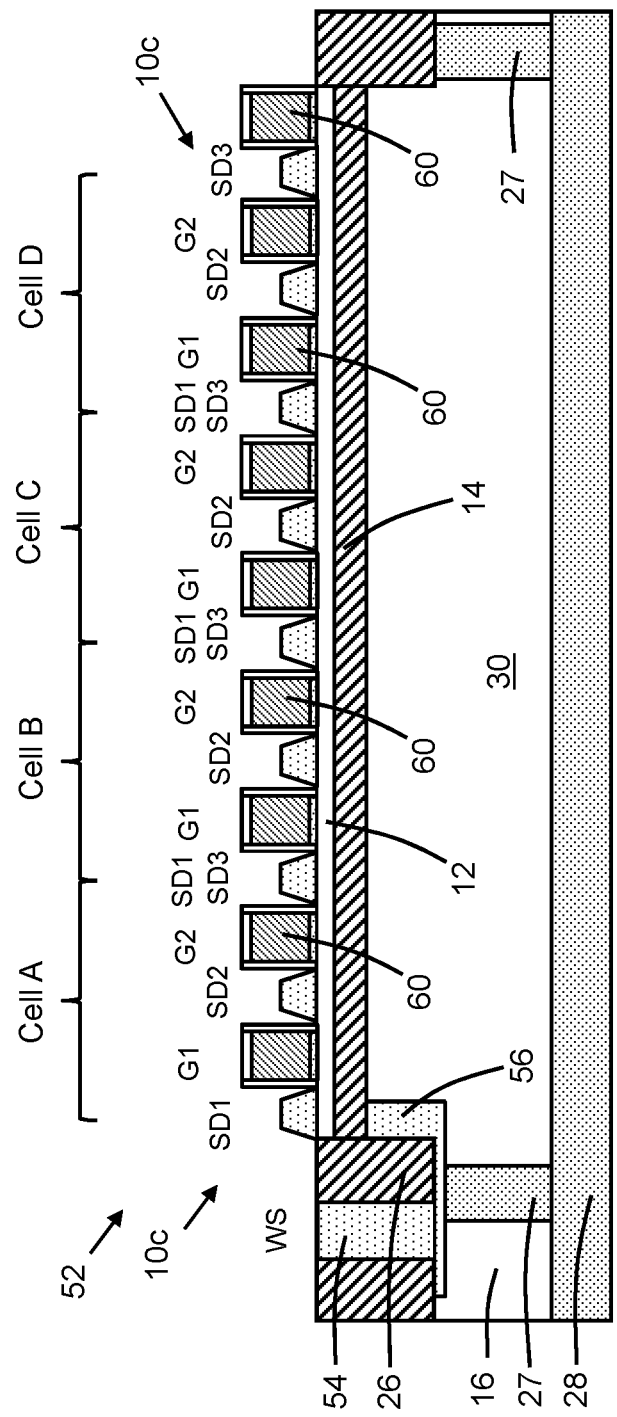
FIG. 6 is a cross-sectional view of a structure in accordance with embodiments of the invention.
Figure 7:
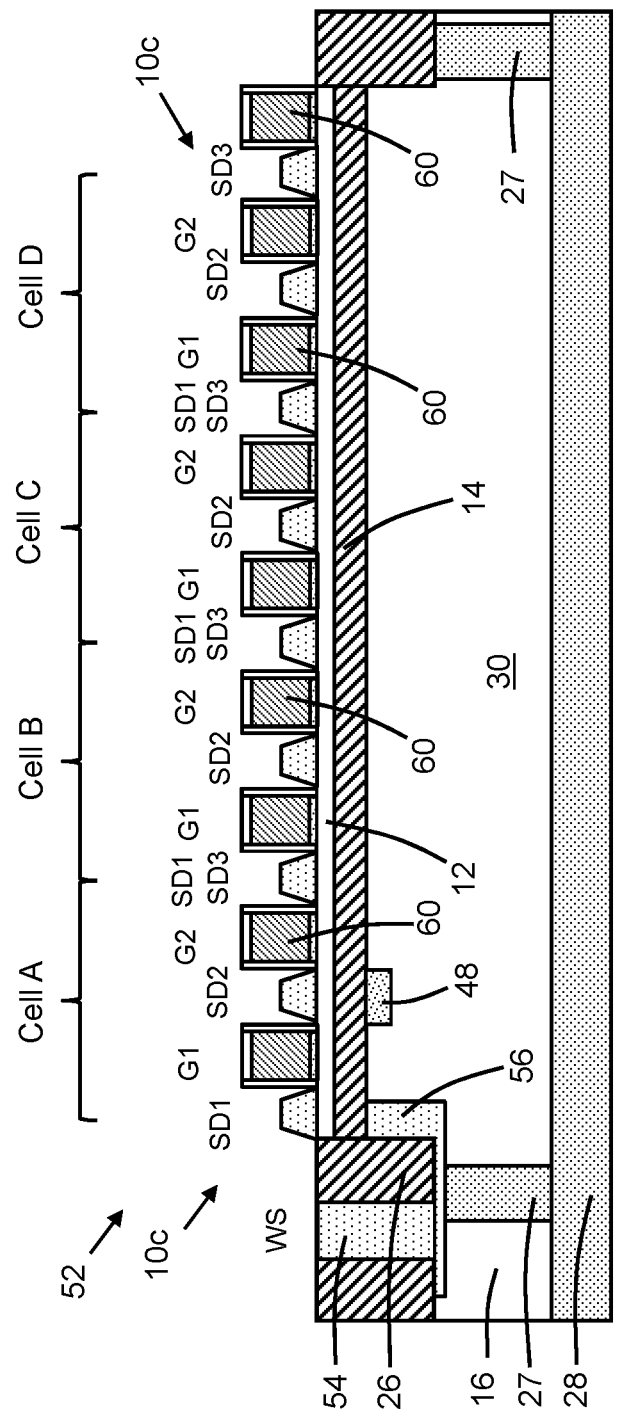
FIG. 7 is a cross-sectional view of the structure of FIG. 6 after being placed in a different memory state.
Figure 8:
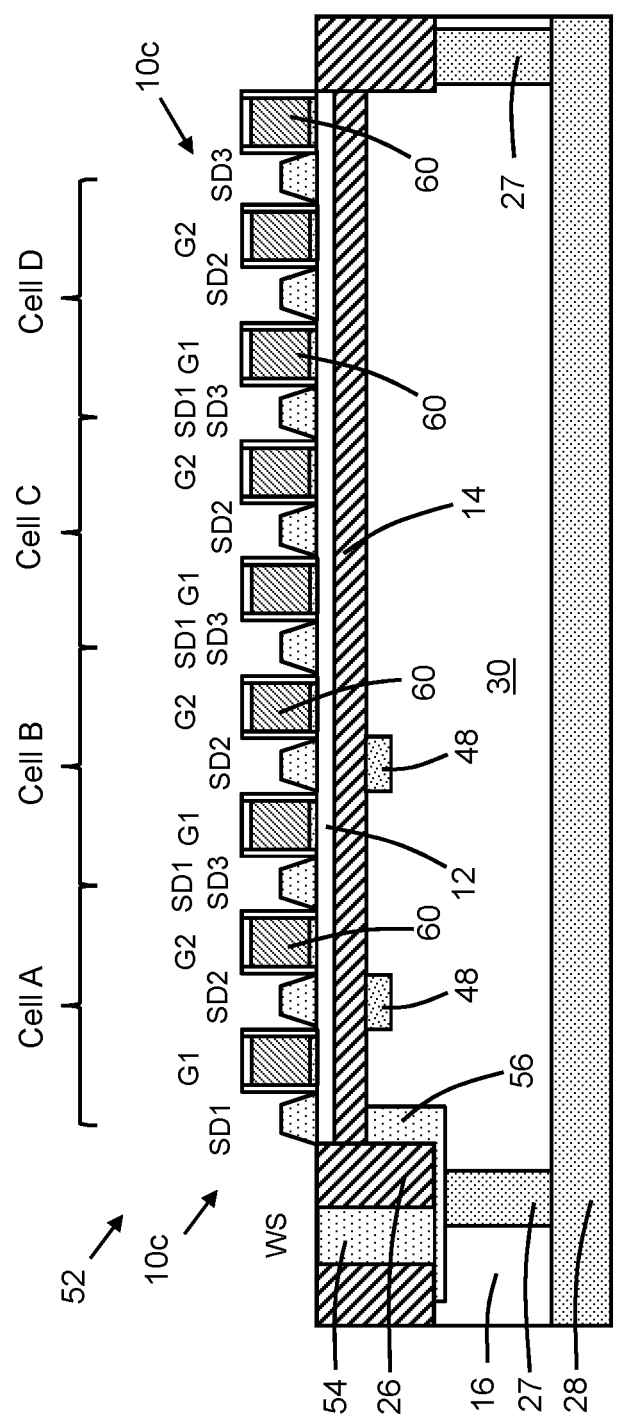
FIG. 8 is a cross-sectional view of the structure of FIG. 6 after being placed in a different memory state.

With reference to FIGS. 6-8 and in accordance with embodiments of the invention, multiple instances 10c of the field-effect transistor 10 may be combined in an array area to form a memory device 52 that is capable of storing multiple bits of data. The instances 10c of the field-effect transistor 10 are fabricated using a section of the device layer 12 that is isolated about its perimeter by the isolation region 26 and that defines an active device region representing a continuous portion of the device layer 12. Each of the instances 10c of the field-effect transistor 10 may be placed side-by-side within the active device region as a linear array of gain cells, specifically as a linear array that includes Cell A, Cell B, Cell C, and Cell D as individual gain cells in the representative embodiment. Each of the instances 10c of the field-effect transistor 10 includes an additional gate electrode 60 that is inserted between adjacent pairs of the instances 10c and at the terminating end of the memory device 52. The additional gate electrodes 60 are utilized in data transfer and storage in a, so-called, bucket brigade action. Each instance 10c includes a source/drain region, SD1, a gate G1, a source/drain region, SD2, a gate G2 (i.e., gate electrode 60), and a source/drain region, SD3. The source/drain region SD1 of a cell instance is shared with the source/drain region SD3 of the adjacent (i.e., next) cell. For example, the source/drain region SD3 of Cell A is physically the same region as the source/drain SD1 of Cell B. Additional instances 10c of the field-effect transistor 10 may be added to extend the number of bits of data that can be stored by the memory device 52, with each instance 10c enabling a single bit of data.

The memory device 52 forming the gain cell array further includes a write source 54 arranged laterally outside of the isolation region 26, and an extension region 56, which electrically connects the write source 54 to a region below the source/drain region SD1 of the gain cell (e.g., the source/drain region SD1 of Cell A). The write source 54 is a doped region of epitaxial semiconductor material formed in a trench that is etched to penetrate through the device layer 12 and the BOX layer 14 and/or an ion-implanted region that extends below the isolation region 26 to reach beneath a portion of the source/drain region SD1 of Cell A. The semiconductor material of this source/drain region SD1 of Cell A, the write source 54, and the extension region 56 may be doped with the same polarity or conductivity type (e.g., n-type) as the other source/drain regions and, in an embodiment, may be heavily doped. The gate electrode G1 is laterally arranged between the source/drain SD1 and source/drain region SD2. The gate electrode G2 is laterally arranged between the source/drain region SD2 and the source/drain region SD3. A multiplicity of Cells A-D is formed by a repetition of this structure, with adjacent cells sharing the source/drain region SD1 and the source/drain region SD3.

A portion of the moat region 30 directly beneath the source/drain regions SD2 of each of the instances 10c of the field-effect transistor 10 can be inverted or depleted so as to individually modulate or change the threshold voltage of the different Cells A-D. In an embodiment, each of the source/drain regions SD1. SD2, and SD3 may represent drain regions and each of the source/drain regions SD1, SD2, and SD3 may represent source regions. The presence of the storage region 48 of inversion charge in the portion of the moat region 30 immediately beneath BOX layer 14 and the overlying source/drain region 24 of each instance 10c represents the high memory state for each of the Cells A-D. The absence of the storage region 48 of inversion charge in the portion of the moat region 30 immediately beneath BOX layer 14 and the overlying source/drain region 24 of each instance 10c represents the low memory state for each of the Cells A-D. The threshold voltage of each instance 10c is modulated by the presence or absence of the storage region 48 containing inversion charge. Each instance 10c has a given threshold voltage when the storage region 48 of inversion charge is present and a different threshold voltage when the storage region 48 of inversion charge is absent.

As shown in FIG. 7, a series of write operations may generate and store the storage regions 48 of inversion charge in respective portions of the moat region 30 in the substrate 16 beneath the source/drain region SD2 of the Cells A. The write source 54 is selectively biased and charge is transferred from the write source 54 through the extension region 56 to a portion of the moat region 30 beneath the source/drain region SD2 in Cell A. The source/drain region SD1 and the gate electrode G1 of Cell A may be biased to a positive voltage to provide a path from the extension region 56 to the portion of the moat region 30 beneath the source/drain region SD2. The source/drain region SD2 of the instance 10c in Cell A may be biased to a positive voltage that is greater than that the positive voltages applied to source/drain SD1 and gate electrode G1, such the voltage applied at write source 46 determines the quantity of inversion charge. The higher voltage on the source/drain region SD2 ensures that most of the inversion charge introduced from the extension region 56 will reside in the portion of the moat region 30 beneath the source/drain region SD1 (i.e., in the storage region 48). The amount of transferred inversion charge is proportional to the voltage applied to the source/drain region SD2, with respect to the write source 54 voltage, less that of the bulk threshold voltage (typically approximately −0.2V), mathematically stated, $V_{SD2}-V_{T-BULK}-V_{WS}$. The formation of the storage region 48 of a greater amount of inversion charge writes a high memory state, while a lesser amount of inversion charge writes a low state.

As shown in FIG. 8, a sequence of voltages can transfer the inversion charge written in FIG. 7 to Cell A from Cell A to cell B, while writing a new value (i.e., amount of inversion charge) into cell A. This may be accomplished by the following sequence.

1. In data retention mode, the gate electrode G1, the gate electrode G2, and the shared source/drain regions SD1/SD3 are at a low voltage (e.g., 0V), and the source/drain region SD2 is at a high voltage (e.g. VDD) for all of the Cells A-D. This state will keep inversion charge at its written value for a retention time, as discussed in connection with previous embodiments.

2. A voltage greater than VDD (e.g., 1.2×VDD) is applied to the gate electrode G2 for all Cells A-D, which transfers the inversion charge beneath the source/drain region SD2 of each cell to a portion of the moat region 30 beneath the adjacent gate electrode G2. Following this transfer, the source/drain region SD2 is set to a low voltage (e.g., 0V).

3. The source/drain region SD3 (which is the same node as SD1, physically) of all Cells A-D is biased above the voltage on the adjacent gate electrode G2, followed by returning the gate electrode G2 to a low voltage, resulting in all Cells A-D transferring their respective inversion charges to a portion of the moat region 30 beneath the shared source/drain region SD3/SD1.

4. The gate electrode G1 is biased above the voltage of the shared source/drain region SD3/SD1 in all Cells A-D, effecting a transfer of inversion charges to respective portions of the moat region 30 below the source/drain regions SD1. Following the transfer, the gate electrodes G1 are returned to a low voltage. Finally, the source/drain regions SD2 are biased above the voltage on the gate electrodes G1 for all Cells A-D, followed by a return of the voltage applied to the source/drain regions SD2 to a low voltage (e.g., 0V), transferring the inversion charges to portions of the moat region 30 beneath the source/drain regions SD2.

This sequence accomplishes a lateral shift of data from each cell to its nearest neighboring cell, while writing new data at the write source end of the gain cell array with each full cycle. In this manner, the entire array of gain cells can be written to arbitrary values of stored inversion charge below the source/drain regions SD2 of each of the individual Cells A-D.

Write operations may be used to place one of the storage regions 48 containing inversion charge in a portion of the moat region 30 in the substrate 16 beneath the source/drain region SD2 of each of the Cells A-D or of one or more of the Cells A-D.

The memory state of each of the gain cells (Cells A-D) may be read by applying a bias voltage at the source/drain region SD3 to generate a potential difference (e.g., 0.1 volts) between the source/drain region SD3 and the source/drain region SD2, and then applying one or more sequential bias voltages to the gate electrodes G2, while each gate electrode G1 is held low (0V) to isolate adjacent Cells A-D from one another. For example, the bias voltage applied to the gate electrode G2 may be equal to the bias voltage at the source/drain region SD2 plus one-half of the difference between the different threshold voltages of instances 10c of the field-effect transistor 10. The sensed current at the source/drain region SD2 (or alternatively, at the source/drain region SD3) indicates whether the particular gain cell associated with a given instance 10c is in a low memory state or a high memory state. The amount of charge stored in the storage region 48 is unchanged by the read operation. The gate electrodes G1 are held in the off-state to isolate the different gain cells (Cells A-D) associated with the different instances 10c of the field-effect transistor 10.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a silicon-on-insulator wafer including a device layer, a substrate, and a buried insulator layer between the device layer and the substrate;
    a first field-effect transistor including a first source/drain region, a second source/drain region, and a first gate electrode that are over the buried insulator layer;
    a moat region in the substrate beneath the first field-effect transistor;
    a well in the substrate beneath the moat region;
    an isolation region extending through the device layer and the buried insulator layer into the substrate, the isolation region arranged to surround a portion of the moat region and a portion of the device layer, and the portion of the device layer defining an active device region for the first field-effect transistor; and
    a fence region extending between the well and the isolation region, the fence region arranged to surround the portion of the moat region.

2. The structure of claim 1 further comprising:
    a doped region of semiconductor material in the moat region, the doped region configured to be biased to provide charge that is transferred to generate a first storage region of inversion charge that is stored in the moat region beneath the first source/drain region.

3. The structure of claim 2 wherein the moat region contains semiconductor material having a first conductivity type, and the semiconductor material of the doped region has a second conductivity type opposite to the first conductivity type.

4. The structure of claim 3 wherein the first source/drain region and the second source/drain region each contain semiconductor material having the second conductivity type.

5. The structure of claim 2 further comprising:
    a second field-effect transistor including a first source/drain region, a second source/drain region, and a first gate electrode that are arranged over the buried insulator layer,
    wherein the second field-effect transistor is configured to generate a second storage region of inversion charge that is stored in the moat region beneath the first source/drain region of the second field-effect transistor.

6. The structure of claim 5 wherein the doped region is laterally arranged in the moat region between the second source/drain region of the first field-effect transistor and the second source/drain region of the second field-effect transistor.

7. The structure of claim 6 wherein the doped region is laterally arranged in the moat region between the first gate electrode of the first field-effect transistor and the first gate electrode of the second field-effect transistor.

8. The structure of claim 5 wherein the second source/drain region and the first gate electrode of the first field-effect transistor are laterally arranged between the doped region and the second source/drain region of the first field-effect transistor.

9. The structure of claim 8 wherein the second source/drain region and the first gate electrode of the second field-effect transistor are laterally arranged between the doped region and the second source/drain region of the second field-effect transistor.

10. The structure of claim 2 wherein the doped region is laterally arranged in part on an opposite side of the isolation region from the portion of the moat region.

11. The structure of claim 10 further comprising:
    a third source/drain region arranged in the active device region, the third source/drain region coupled with the doped region for receiving the charge from the doped region; and
    a third gate electrode arranged in the active device region between the third source/drain region and the first field-effect transistor.

12. The structure of claim 10 wherein the first field-effect transistor includes a second gate electrode that is laterally arranged between the first source/drain region of the first field-effect transistor and the second source/drain region of the second field-effect transistor.

13. The structure of claim 1 wherein the device layer has a thickness ranging from about 3 nm to about 10 nm, and the buried insulator layer has a thickness ranging from about 5 nm to about 50 nm.

* * * * *